US012790205B2

(12) United States Patent
Sommer et al.

(10) Patent No.: US 12,790,205 B2
(45) Date of Patent: *Nov. 10, 2026

(54) MICROELECTROMECHANICAL DEVICE AND MICROELECTROMECHANICAL LOUDSPEAKER

(71) Applicant: Robert Bosch GmbH, Stuttgart (DE)

(72) Inventors: Maximilian Sommer, Dresden (DE); Anton Melnikov, Dresden (DE)

(73) Assignee: ROBERT BOSCH GMBH, Stuttgart (DE)

( * ) Notice: Subject to any disclaimer, the term of this patent is extended or adjusted under 35 U.S.C. 154(b) by 215 days.

This patent is subject to a terminal disclaimer.

(21) Appl. No.: 18/762,730

(22) Filed: Jul. 3, 2024

(65) Prior Publication Data

US 2025/0019228 A1 Jan. 16, 2025

(30) Foreign Application Priority Data

Jul. 11, 2023 (DE) ..................... 10 2023 206 568.1

(51) Int. Cl.
*B81B 7/00* (2006.01)

(52) U.S. Cl.
CPC .... *B81B 7/0061* (2013.01); *B81B 2201/0257* (2013.01); *B81B 2203/0136* (2013.01); *B81B 2203/0163* (2013.01); *B81B 2203/0315* (2013.01); *B81B 2203/0353* (2013.01); *B81B 2203/04* (2013.01)

(58) Field of Classification Search
CPC .................. H04R 19/005; H04R 19/02; H04R 2201/003; B81B 3/0021; B81B 2201/0257; B81B 2203/0315; B81B 2203/0323; B81B 2203/04; B81B 2207/053; B81B 2207/09; B81B 3/0072; B81B 2203/0127; B81B 2203/0172; B81B 7/0061; B81B 2203/0136
See application file for complete search history.

(56) References Cited

U.S. PATENT DOCUMENTS

| | | | |
|---|---|---|---|
| 2012/0018244 A1 | 1/2012 | Robert | |
| 2013/0209269 A1 | 8/2013 | Gleiner et al. | |
| 2021/0297787 A1 | 9/2021 | Lo et al. | |
| 2024/0425358 A1* | 12/2024 | Melnikov | B81B 3/0072 |

FOREIGN PATENT DOCUMENTS

| | | |
|---|---|---|
| DE | 102019203914 B3 | 7/2020 |
| WO | 2021093950 A1 | 5/2021 |
| WO | 2021144400 A1 | 7/2021 |
| WO | 2021223886 A1 | 11/2021 |

* cited by examiner

*Primary Examiner* — Carolyn R Edwards
*Assistant Examiner* — Julie X Dang
(74) *Attorney, Agent, or Firm* — NORTON ROSE FULBRIGHT US LLP

(57) ABSTRACT

A microelectromechanical device for generating a fluid pressure using a displacer unit. The displacer unit has a movable displacer element, which can be deflected to generate a fluid pressure using a drivable connecting element acting on the displacer element. The connecting element has a base structure and a coupling structure connected to the base structure for connecting the connecting element to the displacer element. The base structure includes a mass reduction portion with a material recess. A microelectromechanical loudspeaker having such a microelectromechanical device is also described.

13 Claims, 10 Drawing Sheets

A - A

A - A

A - A

A - A

A - A

A - A

A - A

A - A

MICROELECTROMECHANICAL DEVICE AND MICROELECTROMECHANICAL LOUDSPEAKER

CROSS REFERENCE

The present application claims the benefit under 35 U.S.C. § 119 of German Patent Application No. 10 2023 206 568.1 filed on Jul. 11, 2023, which is expressly incorporated herein by reference in its entirety.

FIELD

The present invention relates to a microelectromechanical device and a microelectromechanical loudspeaker.

BACKGROUND INFORMATION

Microelectromechanical devices and loudspeakers, also known as microelectromechanical structures under the term “MEMS,” are described, for example, in U.S. Patent Application Publication No. US 2021/0297787 A1, which describes a sound generation chip having a membrane, a coupling plate and a spring structure, as well as an actuator for exciting the membrane.

PCT Patent Application No. WO 2021/144400 A1 describes a MEMS transducer comprising an oscillatable membrane having vertical portions that can be excited to oscillate horizontally.

PCT Patent Application No. WO 2021/223886 A1 relates to a MEMS having a layer structure and a cavity arranged therein, in which an interaction structure movably arranged along a plane direction is formed.

German Patent No. DE 10 2019 203 914 B3 describes a MEMS having a movable layer arrangement in a cavity, which is moved along a substrate plane by an electrical potential between two of three bars arranged in the layer arrangement.

U.S. Patent Application Publication No. US 2012/0018244 A1 relates to a MEMS loudspeaker having a cavity delimited by a deformable structure and an actuator for displacing or deforming the structure in order to generate a pressure pulse.

SUMMARY

According to features of the present invention, a device for generating a fluid pressure using a displacer unit is provided, wherein the displacer unit has a movable displacer element which can be deflected to generate a fluid pressure by means of a drivable connecting element acting on the displacer element, wherein the connecting element has a base structure and a coupling structure connected to the base structure for connecting the connecting element to the displacer element, wherein the base structure has a mass reduction portion with a material recess.

In other words, the base structure can have, at least in portions, a region with a hollow space. Weight savings can therefore be achieved compared with solidly constructed full-form fastener elements. By appropriate positioning and dimensioning of the material recess, sufficient rigidity of the base structure can be ensured. By reducing the mass, the connecting element can be driven more easily and quickly, and the limit frequency or natural frequency of the device can also be positively influenced. For example, a frequency-dependent increase in fluid pressure can be achieved. In addition, parasitic modes can be shifted. Furthermore, a reduced-mass connecting element can shorten the transient response of the device, thus improving the latency of the device. In addition, the power required to drive the connecting element is reduced, thus achieving greater efficiency.

According to an example embodiment of the present invention, a displacer unit of the device can be a mechanical structure of the device which includes a variable displacer volume and is configured to generate a fluid pressure by increasing and/or reducing the displacer volume.

According to an example embodiment of the present invention, the displacer element can be a flat, deflectable structure having a height and length several times greater than the width, wherein the height and length span a displacer plane which can be aligned in particular vertically in the displacer unit. The displacer element can, for example, have a width between 0.5 and 100 μm, in particular between 1 and 50 μm. The displacer element can, for example, have a length between 100 and 10,000 μm, in particular between 1,000 and 5,000 μm. The displacer element can, for example, have a height between 1 and 1,000 μm, in particular between 50 and 800 μm. In particular, the connecting element can be moved substantially in a drive direction perpendicular to the displacer plane in order to deflect the displacer element. The connecting element can be connected to an outer edge of the vertically aligned displacer element. The displacer unit can also have a plurality of movable displacer elements. A movable displacer element can limit a displacer volume with another movable displacer element and/or with a fixed structure, for example with a fixed counter element, such as a partition wall or with a holding structure such as a frame. The connecting element can, for example, limit the displacer volume perpendicular to the fixed structure and seal the displacer volume in particular in a fluid-tight manner. The displacer unit can have a fluid opening in a structure delimiting the displacer volume to allow fluid entry into the displacer volume and/or fluid exit from the displacer volume.

The fluid opening can be arranged, for example, in a bottom surface of the displacer unit opposite the connecting element or in the connecting element. A deflection of the movable displacer element leads to a change in the displacer volume, so that a fluid pressure is generated. A plurality of displacer elements can, for example, be arranged periodically one after the other in a holding structure of the displacer unit. The connecting element of the device can be configured for the simultaneous deflection of a plurality of displacer elements and can be connected to them via a relevant coupling structure.

According to an example embodiment of the present invention, the connecting element of the device is configured to deflect the displacer element in order to change the displacer volume and thus generate a fluid pressure. In the present application, a connecting element is understood to mean a movable actuator element which is part of an actuator system having a drive apparatus and the connecting element which can be driven by the drive apparatus. The connecting element can represent a so-called shuttle. The connecting element serves to transmit force from the drive apparatus to the displacer element and can, for example, be moved along a predefined path of movement in one direction of movement. The drive apparatus can be configured to be able to drive the connecting element in opposite directions of movement in order to be able to deflect the displacer element in opposite directions. The drive apparatus can be, for example, an electrostatic, piezoelectric or other suitable drive apparatus, wherein the drive concept can be based, for example, on comb structures, electrostatic bending actuators (nanoscopic electrostatic drive, NED) or micro muscles.

According to an example embodiment of the present invention, the connecting element has a base structure. The base structure of the connecting element can define a basic shape of the connecting element; for example the base structure can be a cuboid-shaped or cylindrical base body. The base structure can have a larger overall size than the coupling structure; in particular it can be several times larger than the coupling structure of the connecting element. The base structure can be driven by the drive apparatus. The base structure, together with the coupling structure, serves as a force transmitter for the deflection of the displacer element. Further components of the connecting element can be connected to the base structure, for example at least one spring structure for resetting the connecting element after it has been driven in a direction of movement or for facilitating oscillatory movements, for example between two opposing spring structures. The base structure can have a larger width than the displacer element, for example a width between 0.5 and 10,000 μm. The base structure can, for example, have a height between 0.5 and 600 μm, in particular between 5 and 60 μm.

According to an example embodiment of the present invention, the connecting element has a coupling structure connected to the base structure for connecting the connecting element to the displacer element. The coupling structure represents a link between the base structure and the displacer element and can be designed as a substantially point-based coupling, in other words as a coupling point, in order to reduce stiffening of the displacer element. A coupling point can have a smaller overall dimension than the base structure and in particular can be several times smaller than the base structure, for example have a height between 0.01 and 20 μm, in particular between 0.1 and 3 μm. For example, the width and thickness of a coupling point can in each case be between 0.5 and 2,000 μm.

According to an example embodiment of the present invention, it is provided that the base structure has a mass reduction portion with a material recess. A mass reduction portion can be a region or sub-region of the base structure in which a material change to the base structure is specifically made to reduce the base structure mass. According to some embodiments, the mass reduction portion can extend over the entire base structure. In this case, the material change is designed as a material recess, i.e., as a material gap. The material recess can be created, for example, by material that was deliberately not introduced during the manufacture of the base structure or was later removed again. The outer contours or outer surfaces of the base structure can form an outer frame of the base structure which encloses a structural region or a structural volume of the base structure within which the mass reduction portion with a material recess is present. There can also be a plurality of mass reduction portions on a base structure. The material recess can be present substantially at certain points as a micro-recess or it can occupy a larger contiguous subregion of the base structure, for example a tenth, a quarter, a third or half of the structural area or structural volume spanned by a frame of the base structure. In principle, it is also possible to provide a material recess in an outer surface or the frame of the base structure. In principle, it is possible to refill the material recess with another, particularly lighter material, for example to increase the rigidity of the base structure. According to some embodiments of the present invention, the material recess is designed as a free space. Accordingly, the base structure is not designed as a solid, full-form structure throughout, but has at least one hollow space. Due to the mass reduction portion, the base structure can be referred to as a lightweight component and/or produced using so-called lightweight construction. The basic function of power transmission is fulfilled and supplemented by additional lightweight construction advantages. In lightweight construction, material for manufacturing the component is concentrated in regions where higher loads can occur due to the design or function, and reduced in component regions where reduced loads are to be expected. The base structure presented here provides a directed force transmission from the drive apparatus to the displacer element along force paths, so that the base structure is suitable for the application of the lightweight construction concept. Regions of higher and lower stress concentrations and relevant force paths on connecting elements can be ascertained, for example, using suitable topology optimization and simulation programs, for example using the finite element method. The structural design of the mass reduction portion can take into account the fact that semiconductor materials commonly used to manufacture MEMS devices, such as silicon materials, have directionally related, anisotropic properties that can be used to manufacture the connecting element in a lightweight construction. For example, it can be provided that the material orientation in the base structure corresponds to at least one force-path-dependent stiffening direction of the base structure.

According to one embodiment of the present invention, the material recess is formed as a cavity region which occupies a partial volume of at least 5% of the total volume of the base structure. In particular, the cavity region can occupy a partial volume of at least 10%, of at least 20% or of at least 30% of the total volume of the base structure. The cavity region can be a material-free volume region in the base structure. The cavity region can form a continuous hollow volume. The volume of the base structure, also called capacity, can be understood as the spatial content of the basic geometric body of the base structure, which is defined, for example, by its outer contours. The cavity region can form a chamber within the base structure. A portion of the base structure in which the cavity region is formed can be regarded as a mass reduction portion. The cavity region can basically have any contour, for example a predominantly cuboid or cylindrical contour. Due to the included cavity region, the base structure can form a hollow body at least in portions.

According to one embodiment of the present invention, the coupling structure can be formed as a coupling rib extending through the cavity region. This achieves a favorable ratio between a mass reduction through the cavity region and sufficient force transmission via the coupling rib, wherein the coupling rib contributes to increasing the rigidity of the base structure. The base structure can, for example, comprise a frame having at least one wall structure to which the coupling rib is connected. For example, the base structure can have a box shape with four side walls and a cover wall on an upper side of the base structure facing the drive apparatus, which walls are connected to one another and can, for example, have a U-shaped profile in a lateral cross section, so that the base structure is designed to be open to an underside facing a displacer element. Here, the coupling rib can be connected to the cover wall and/or to two opposing side walls. The side walls and the cover wall can delimit the cavity region at least in portions. The coupling rib can have a ridge shape or plate shape in which the width of the coupling rib is several times smaller than the length and height of the coupling rib; the width can be an extension parallel to the direction of movement of the drivable connecting element. According to one exemplary embodiment, the width of the coupling rib can be less than 20% of the width of the connecting element, in particular less than 10% or less than 5% of the width of the connecting element; the width of the connecting element can be an extension of the connecting element parallel to the width of the coupling rib. The base structure can have a plurality of coupling ribs which extend at a distance from one another through the same cavity region or through two separate cavity regions. The coupling rib can be connected to a displacer element on an underside of the coupling rib, which can be facing away from a cover wall of the base structure or from the drive apparatus, for example.

In other embodiments of the present invention, the coupling structure can, for example, be integrally formed on a bottom wall of the base structure, wherein the bottom wall of the base structure can be arranged on an underside of the base structure facing the displacer element.

According to one embodiment of the present invention, the coupling structure can have a material reinforcement in portions. This enables local stiffening of the coupling structure and improved force transmission. For example, the coupling structure can have a material reinforcement on a subportion of the coupling structure that is closer to the drive apparatus than to the displacer element. However, it is also possible to provide the material reinforcement on a subportion of the coupling structure that is closer to the displacer element than to the drive apparatus. A material reinforcement can, for example, be an expansion of the cross section of the coupling structure. For example, a coupling structure that is basically designed in the form of a ridge or plate and has a cuboid-shaped cross section can change into a conical or pyramidal cross-sectional shape at a subportion facing the drive apparatus. A material reinforcement can, for example, also be a projection integrally formed on the coupling structure.

According to one embodiment of the present invention, the base structure can have at least one wall structure with a predominantly closed wall surface. This allows a high rigidity of the base structure to be achieved in the region of a wall structure. A wall structure can be a flat material structure of the base structure adjacent to a cavity region. The wall structure can have a width several times smaller than its length and height. The wall structure can form an outer wall of the base structure. The wall structure can, for example, form a side wall, a cover wall or a bottom wall of the base structure. The wall structure can also form an inner wall of the structure, for example an inner partition wall between two cavity regions of the base structure. A predominantly closed wall surface can be understood as a substantially continuous wall structure. A predominantly closed wall surface can have one or more material recesses or through openings, for example an etching channel or a plurality of etching channels, wherein the total recess area of the material recesses takes up, for example, no more than 20% or no more than 10% of the total area of the wall structure. It is also possible to provide wall structures with completely closed wall surfaces on the base structure. In addition, it is possible to provide wall structures with different wall thicknesses from wall structure to wall structure or with different wall thicknesses within a wall structure, for example to provide a base structure with a cover wall that has a greater wall thickness than a side wall of the base structure. In addition, a wall structure, for example a cover wall, a side wall or a base wall, can have subportions with different thicknesses, for example a higher thickness in the region of a coupling structure than in a region away from a coupling structure. This also allows local weight and rigidity optimizations to be achieved. Furthermore, it is possible to provide open wall regions or open sides on the base structure, for example to provide a base structure without a bottom wall, without a top wall and/or with a reduced number of side walls. This can also result in weight savings.

According to one embodiment of the present invention, the base structure can have at least one etching channel for producing the material recess. This enables easy creation of material recesses, for example cavity regions, by means of an etching process. The etching channel can extend, for example, through a wall structure of the base structure, for example through a bottom wall of the base structure. During the production of microelectromechanical devices, the microelectromechanical structures of the device can be produced, for example, by applying and structuring material layers onto a substrate; etching processes are regularly used for targeted local material removal, and therefore they can also be used to produce material recesses. In principle, however, it is also possible to produce the base structure generatively by leaving out material at the intended material recesses, for example by growth processes.

According to one embodiment of the present invention, the material recess can be formed as a micropore which occupies a partial volume of at most 20% of the total volume of the base structure. In particular, the micropore can occupy a partial volume of no more than 10% or no more than 5% of the total volume of the base structure. This allows the rigidity of the mass-reduced base structure to be optimized. In addition, a high fluid-tightness of the connecting element can be achieved. The partial volume occupied refers in particular to the volume of a single micropore, although the base structure can have a plurality of micropores. According to some embodiments, it can also be provided that all micropores of the base structure occupy a common partial volume of at most 20% of the total volume of the base structure, in particular of at most 10% or at most 50%. The micropore can be within the range of one nanometer to one micrometer in size. The micropore can, for example, be designed as a through-channel through the base structure, so that a perforated base structure is present. The micropore can, for example, be introduced into the base structure as a puncture channel or blind hole channel, so that a perforated base structure is present. The micropore can also be a micro-cavity included in the base structure. If the base structure has a plurality of enclosed micro-cavities, it can be simplified as a foam structure. According to one embodiment, a regular arrangement of micropores can be present in the base structure, for example through periodically spaced through-channels or puncture channels. Alternatively or additionally, an irregular arrangement of micropores can be present in the base structure, for example through micro-cavities distributed in the manner of a foam structure. According to some embodiments, the micropore can be present in a wall structure of the base structure, extend into a wall structure of the base structure, and/or extend through a wall structure of the base structure. Alternatively, the micropore can be provided apart from a wall structure of the base structure. If the microelectromechanical device is designed as an acoustic device of which the displacer unit is configured to generate sound pressure and the base structure has a plurality of micropores, these can be arranged and dimensioned such that they act as an acoustic filter whose passband lies outside the acoustic frequency range in which the device generates the sound pressure.

According to one embodiment of the present invention, the mass reduction portion can have at least two spatially separated material recesses. In this way, an effective reduction in mass can be achieved, but the rigidity of the base structure can be improved compared with a direct transition of the material recesses into one another. For example, two spatially separated cavity regions can be provided in one mass reduction portion. The material recesses can be separated from one another, for example, by a wall structure designed as an internal partition wall or by a coupling structure.

In principle, it is possible to combine material recesses of different types in a base structure, for example to provide a cavity region inside the base structure and micropores in a wall structure or micropores in a portion of the base structure adjacent to the cavity region.

According to one embodiment of the present invention, the connecting element can have a spring structure which is arranged at least in portions in a material recess of the base structure. This makes it possible to provide a compact connecting element with a space-saving arrangement of a spring structure and to efficiently integrate a functional component of the connecting element into the base structure. The space-saving arrangement enables more efficient use of the active surfaces of the device. The spring structure can, for example, be a micromechanical elastic spring beam or spring arch which is configured to exert a spring force on the connecting element. The base structure can, for example, have a cavity region that is laterally open as seen in the direction of movement of the connecting element and which is not closed off by a side wall and into which the spring structure can penetrate at least in portions. For example, the spring structure can be supported on a support structure at an end facing away from the connecting element in order to enable the connecting element to return to its original position after it has been driven in a direction of movement in the event of elastic spring compression, for example, or to realize oscillation processes between two opposing spring structures.

According to one embodiment of the present invention, the connecting element can comprise a spring structure which is formed integrally with the base structure. For example, a wall structure of the base structure, in particular an outer wall structure of the base structure, can have a spring beam or spring arch integrally produced in the base structure. This makes it possible to provide a compact connecting element with a space-saving arrangement of a spring structure and to efficiently integrate a functional component of the connecting element into the base structure.

According to one embodiment of the present invention, the device has a drive apparatus which is arranged at least in portions in a material recess of the base structure of the connecting element. This makes it possible to provide a compact device with a space-saving arrangement of the drive apparatus and to efficiently integrate a functional component of the device into the connecting element. The space-saving arrangement enables more efficient use of the active surfaces of the device. The drive apparatus can, for example, be arranged at least in portions in a cavity region of the base structure and thus drive the connecting element directly from an interior of the base structure.

According to one embodiment of the above-described embodiment of the present invention, the drive apparatus can have at least one fixed drive element and at least one movable drive element. As a result, a particularly compact drive apparatus can be provided. The drive apparatus can, for example, have a comb electrode drive with one or more fixed comb electrode bars and with one or more movable comb electrode bars. The comb electrode bars can each have a plurality of comb electrode fingers to form a comb electrode structure. The movable comb electrode bars can be displaced relative to the fixed comb electrode bars by an applied electrical signal and in doing so entrain the base structure accommodating the drive apparatus. A comb electrode structure enables a uniform and precisely controllable drive movement.

A drive apparatus arranged in the base structure of the connecting element can, for example, be accommodated between a bottom wall and a cover wall of the base structure, so that the drive apparatus is accommodated safely and protected within the base structure. This allows a sandwich-like structure of the base structure to be formed in which the drive apparatus is sandwiched between the base and cover walls.

The device can be, for example, produced as a layered structure having a plurality of functional layers produced between two cover layers or wafers. For example, the displacer element can be arranged in a first functional layer and the connecting element in a second functional layer. The second functional layer can be arranged above and/or below the first functional layer. A coupling structure with which a displacer element is connected to a connecting element can extend between the first and the second functional layer and thereby form an intermediate coupling layer, for example. The drive apparatus can be formed in a drive layer of the layer structure or, according to some embodiments, can be integrated into the second functional layer.

The individual components and structures of the device can advantageously be made of a semiconductor material, such as silicon or silicon compounds.

The displacer unit of the device can be, for example, designed to compress and expand air so that the generated fluid pressure can be, for example, a sound pressure, and the device is suitable for use in an acoustic MEMS, for example a microelectromechanical loudspeaker. According to other exemplary embodiments, the displacer unit can be designed, for example, as a pump or a valve for microfluidic applications.

The present invention also relates to a microelectromechanical loudspeaker which has a microelectromechanical device according to at least one of the features described above, wherein the displacer unit is configured to generate sound pressure as fluid pressure, and which has a signal processing unit for applying and processing signals from the microelectromechanical device. The mass reduction portion provided in the device on the base structure of the connecting element enables weight savings to be achieved while at the same time ensuring sufficient rigidity of the connecting element. By reducing the mass, the connecting element can be driven more easily and quickly, and the limit frequency or natural frequency of the device can also be positively influenced. For example, a frequency-dependent increase in sound pressure can be achieved and parasitic modes can be shifted. Furthermore, a reduced-mass connecting element can shorten the transient response of the device, thus improving latency. In addition, the power required to drive the connecting element is reduced, so that the loudspeaker achieves a higher level of efficiency.

In general, in the context of this application, the words “a/an,” unless expressly defined otherwise, are not to be understood as numerals, but as indefinite articles with the literal meaning of “at least one.” For example, a structure that is “several times” larger or smaller can refer to a value that is at least twice as high or small.

The present invention allows for various embodiments and is explained in more detail below using exemplary embodiments with the figures.

DETAILED DESCRIPTION OF EXAMPLE EMBODIMENTS

Figure 1:
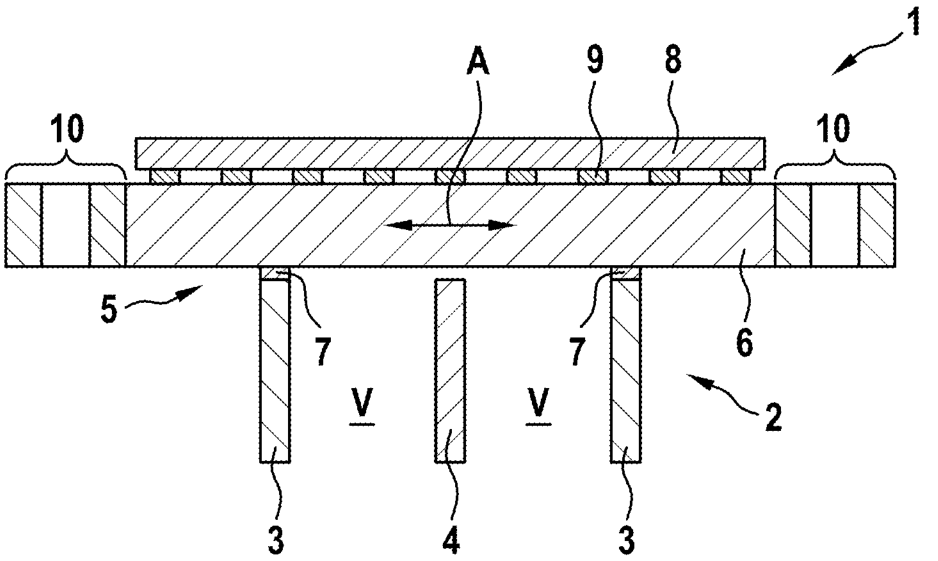
FIG. 1 shows a schematic basic principle of a microelectromechanical device, according to an example embodiment of the present invention.

FIG. 1 schematically shows a device 1 for generating a fluid pressure using a displacer unit 2. According to the exemplary embodiment, the displacer unit 2 has two movable displacer elements 3, which can be deflected to generate a fluid pressure by means of a drivable connecting element 5 acting on the displacer elements 3. As shown, the displacer elements 3 are designed as flat, deflectable structures with a vertical orientation in the displacer unit 2. The connecting element 5 is connected to an outer edge of the displacer elements 3 via a coupling structure 7 and is movable in opposite drive directions A perpendicular to the displacer elements 3 by means of a drive apparatus 8, to which the connecting element 5 is connected via drive coupling elements 9, in order to be able to deflect the displacer elements 3 simultaneously. The movable displacer elements 3, together with a fixed counter element 4, the connecting element 5 and a bottom surface (not shown in detail) opposite the connecting element 5, each define a displacer volume V which can be changed by deflection of the adjacent displacer element 3 in order to generate a fluid pressure.

The connecting element 5 has a base structure 6 and the coupling structures 7 connected to the base structure 6 for connecting the connecting element 5 to the displacer elements 3. The base structure 6 is represented in the shown exemplary embodiments with a cuboid basic shape, but it can in principle also have other basic geometric shapes. The coupling structures 7 have a smaller overall size than the base structure 6. Opposing spring structures 10 are connected to the base structure 6 and enable a return and/or oscillating movement of the connecting element 5.

Figure 2A:
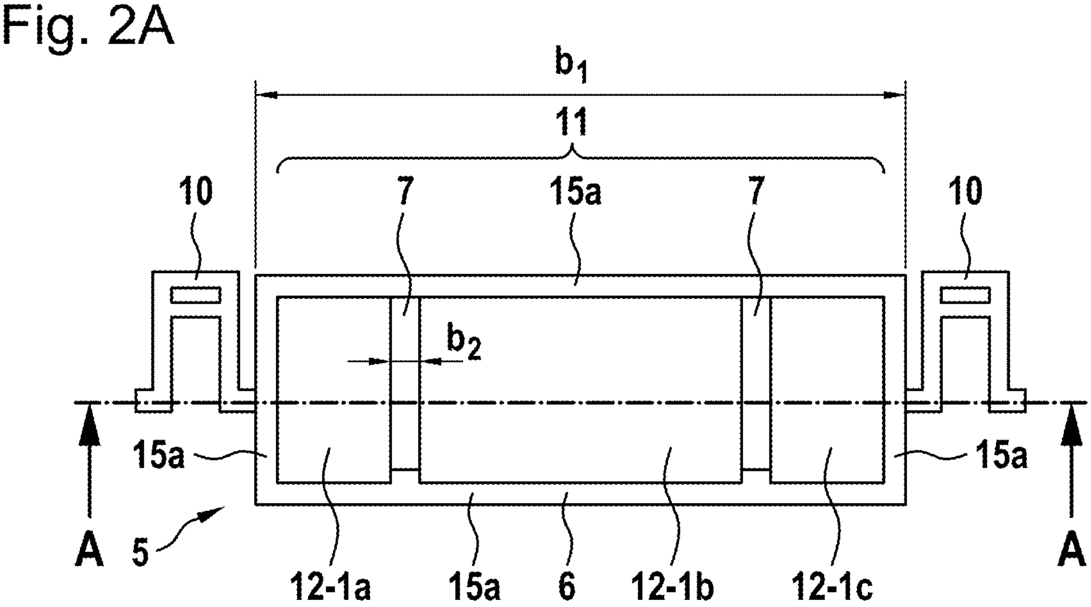
FIGS. 2A-2B show a bottom view and a lateral cross-sectional view of a connecting element of the device according to a first example embodiment of the present invention.
Figure 2B:
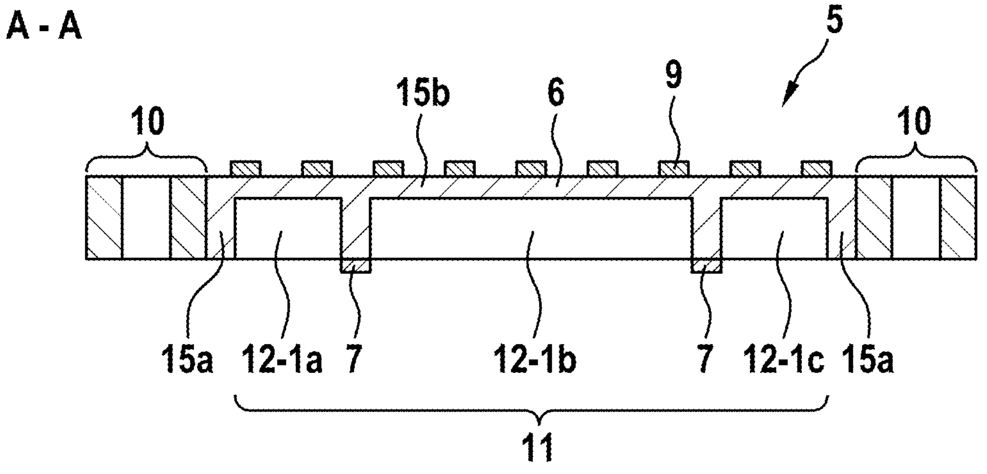

In FIGS. 2A and 2B, a bottom view and a lateral cross-sectional view of a connecting element 5 of the device 1 according to a first embodiment are shown, wherein the lateral cross-sectional view in FIG. 2B is shown along the section line A-A illustrated in FIG. 2A. For the sake of simplicity, the drive apparatus 8, the displacer elements 3 and the fixed counter element 4 are hidden in FIGS. 2A and 2B as well as in some subsequent figures.

From FIGS. 2A and 2B, it can be seen that the base structure 6 of the connecting element 5 has a mass reduction portion 11. The mass reduction portion 11 has material recesses 12, which are formed as a first cavity region 12-1*a*, a second cavity region 12-1*b* and a third cavity region 12-1*c*, as shown. Weight savings on the connecting element 5 can therefore be achieved. The cavity regions 12-1*a*, 12-1*b* and 12-1*c* are spatially separated from one another by coupling structures 7 designed as coupling ribs, or in other words, the coupling ribs extend through a cavity region 12-1 formed by the cavity regions 12-1*a*, 12-1*b* and 12-1*c*.

The base structure 6 substantially has a box shape with four side walls 15*a*, a cover wall 15*b* and an open side toward the displacer element 3. In lateral cross section, the aforementioned wall structures 15 form a U shape. The wall structures 15 form outer walls of the base structure 6 and each have a predominantly closed wall surface and thus a high rigidity. The plate-shaped coupling structures 7 each have a width be that is smaller than 20% of the width bi of the base structure 6. The coupling structures 7 are connected to the cover wall 15*b* and to two opposite side walls 15*a*. The coupling structures 7 can be connected to displacer elements 3 on an underside of the coupling structures 7 facing away from the cover wall 15*b*. The side walls 15*a*, the cover wall 15*b* and the coupling structures 7 delimit the cavity regions 12-1*a*, 12-1*b* and 12-1*c*. Each cavity region 12-1*a*, 12-1*b* and 12-1*c* forms a contiguous cavity volume which occupies a partial volume of the base structure 6 that is greater than 5% of the total volume of the base structure 6. The spring structures 10 are connected to two opposite side walls 15*a* of the base structure 6.

Figure 3A:
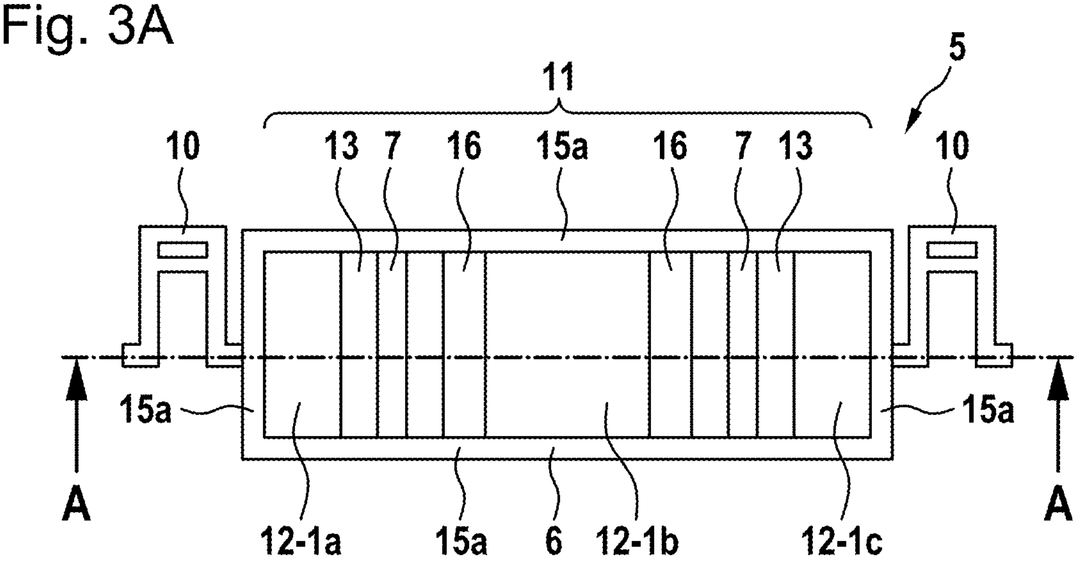
FIGS. 3A-3B show a bottom view and a lateral cross-sectional view of a connecting element of the device according to a second embodiment example embodiment of the present invention.
Figure 3B:
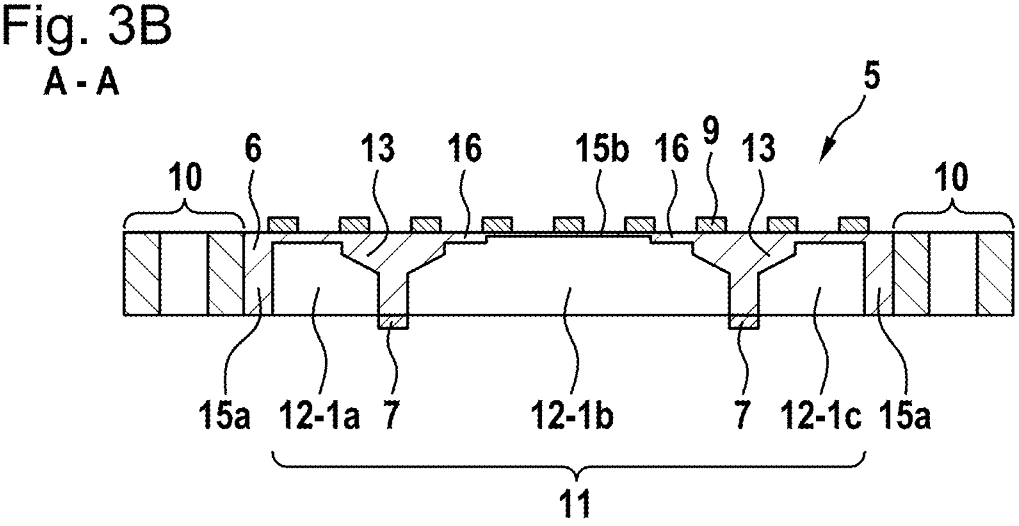

In FIGS. 3A and 3B, a bottom view and a lateral cross-sectional view of a connecting element 5 of the device 1 according to a second embodiment are shown, wherein the lateral cross-sectional view in FIG. 3B is shown along the section line A-A illustrated in FIG. 3A. In its base structure, the connecting element 5 according to the second embodiment is comparable with the connecting element 5 according to the first embodiment. The second embodiment represents a variant of the base structure 6 optimized according to lightweight construction criteria with a topology-optimized mass distribution. In this case, a higher mass concentration is provided in regions of higher load along the force paths from the drive apparatus 8 to the displacer element 3 than in regions of lower load. The base structure 6 has a mass reduction portion 11 with material recesses 12, which are formed as a first cavity region 12-1*a*, a second cavity region 12-1*b* and a third cavity region 12-1*c*, as shown. The coupling structures 7 are basically designed as coupling ribs in a similar manner to the first embodiment, but each have a material reinforcement 13 in the form of a conical cross-sectional widening on a subportion facing the drive apparatus 8 or the drive coupling elements 9. In addition, a wall structure 15 designed as a cover wall 15*b* has a wall structure reinforcement 16 in portions in order to provide local stiffening.

Figure 4A:
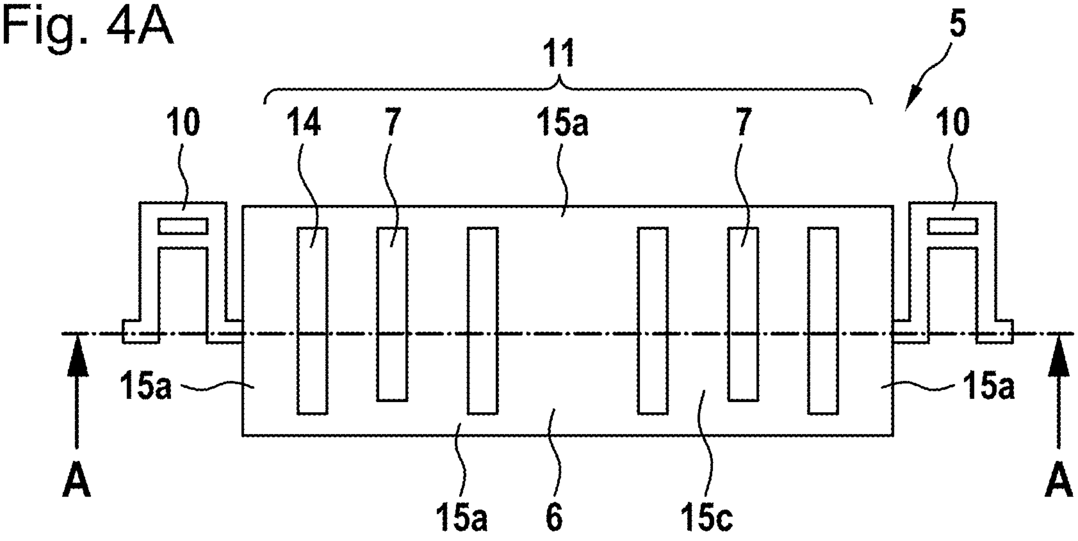
FIGS. 4A-4C show a bottom view and two lateral cross-sectional views of a connecting element of the device according to a third example embodiment of the present invention in two variants.
Figure 4B:
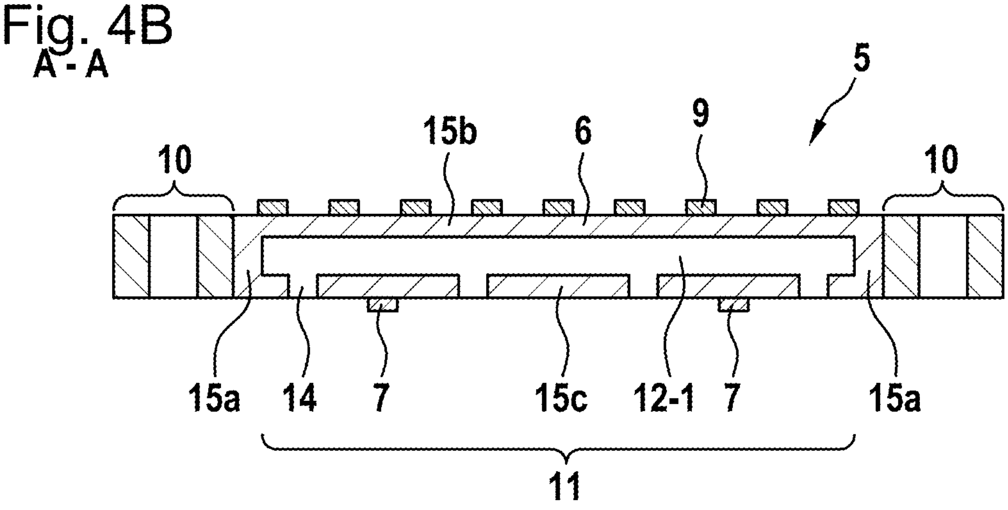
Figure 4C:
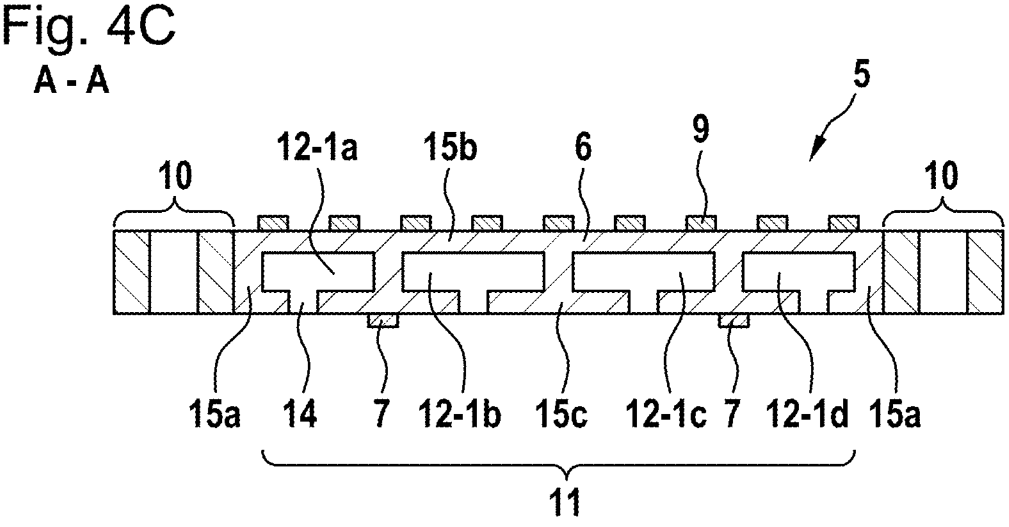

In FIGS. 4A, 4B and 4C, a bottom view of a connecting element 5 of the device 1 according to a third embodiment and two variants of the third embodiment are shown in lateral cross-sectional views, wherein the lateral cross-sectional views in FIGS. 4B and 4C are shown along the section line A-A illustrated in FIG. 4A. In its base structure, the connecting element 5 according to the third embodiment is comparable with the connecting element 5 according to the first embodiment. However, the connecting element 5 according to the third embodiment has on the base structure 6, in addition to the side walls 15*a* and the cover wall 15*b*, a bottom wall 15*c* which, with the other aforementioned wall structures 15, delimits a continuous cavity region 12-1 according to FIG. 4B or, with the aforementioned wall structures 15 and additional inner partition walls, delimits a plurality of spatially separated cavity regions 12-1*a*, 12-1*b*, 12-1*c* and 12-1*d* according to FIG. 4C. As a result, the mass of the base structure 6 can be reduced and the rigidity can be increased by the wall structures 15. Etching channels 14, which are spaced apart from one another, lead through the bottom wall 15*c* and enable the production of the cavity regions 12-1 or 12-1*a*, 12-1*b*, 12-1*c* and 12-1*d* by means of an etching process. In this exemplary embodiment, the coupling structures 7 are integrally formed on the bottom wall 15*c*.

Figure 5A:
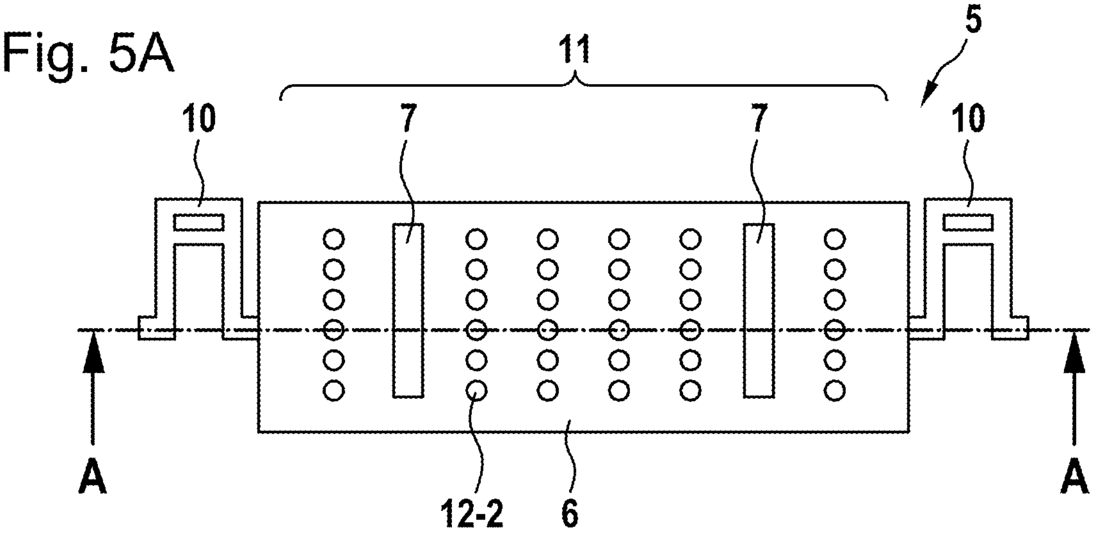
FIGS. 5A-5C show a bottom view and two lateral cross-sectional views of a connecting element of the device according to a fourth example embodiment of the present invention in two variants.
Figure 5B:
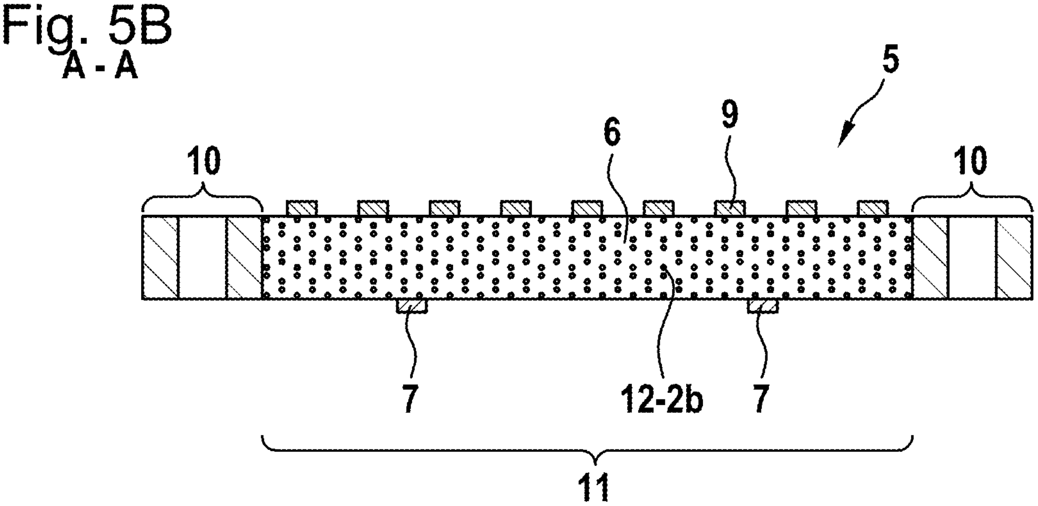
Figure 5C:
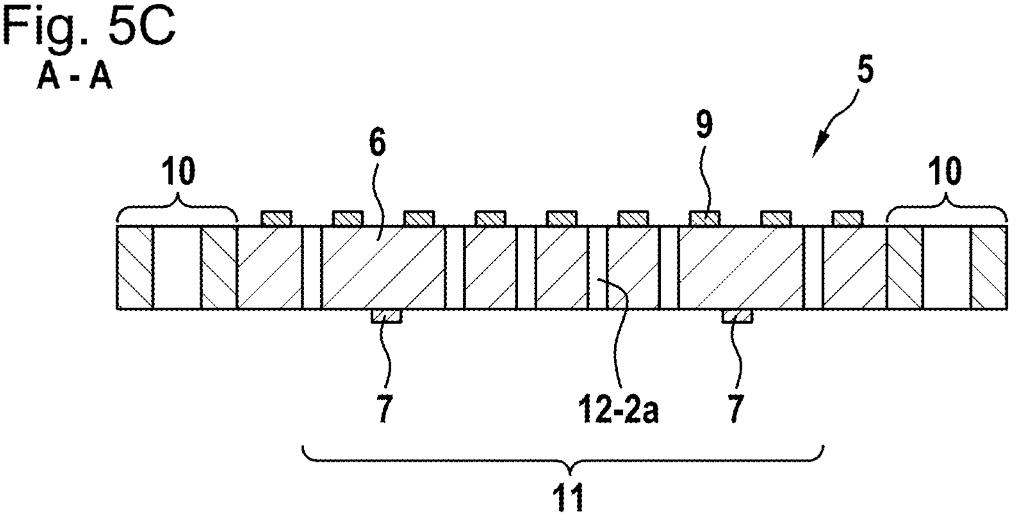

In FIGS. 5A, 5B and 5C, a bottom view of a connecting element 5 of the device 1 according to a fourth embodiment and two variants of the fourth embodiment are shown in lateral cross-sectional views, wherein the lateral cross-sectional views in FIGS. 5B and 5C are shown along the section line A-A illustrated in FIG. 5A. In the fourth embodiment, the base structure 6 of the connecting element 5 has a plurality of micropores 12-2 which form material recesses 12 in a mass reduction portion 11 of the base structure 6. The micropores 12-2 each occupy a partial volume of the base structure 6 that is less than 20% of the total volume of the base structure 6. As a result, the rigidity of the connecting element 5 can be improved and a high fluid tightness can be achieved. According to the variant in FIG. 5B, the mass reduction portion 11 is designed as a foam structure having a plurality of enclosed micro-cavities 12-2*b*. According to the variant in FIG. 5C, the mass reduction portion 11 has a plurality of spaced-apart through-channels 12-2*a*.

Figure 6A:
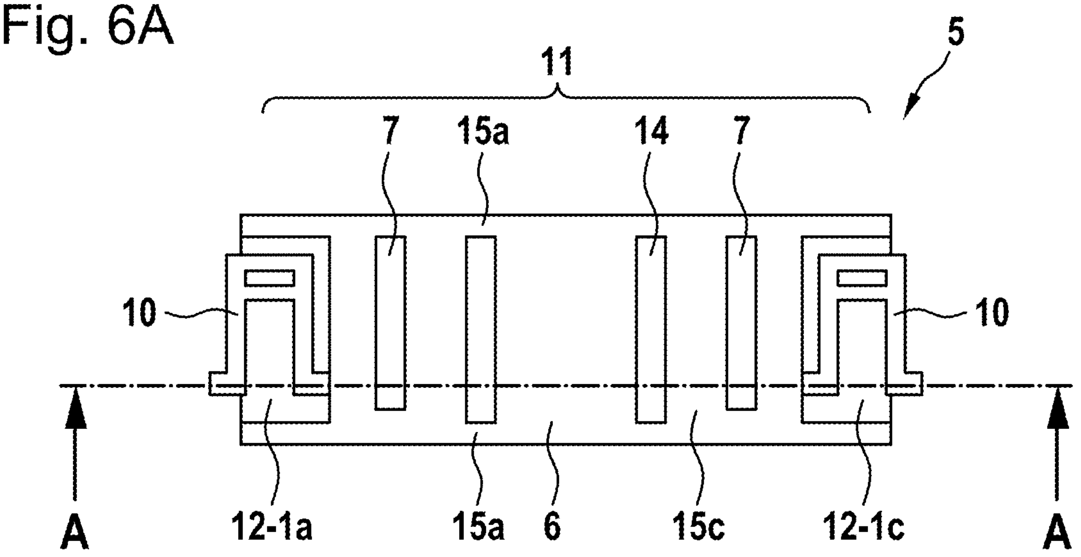
FIGS. 6A-6B show a bottom view and a lateral cross-sectional view of a connecting element of the device according to a fifth example embodiment of the present invention.
Figure 6B:
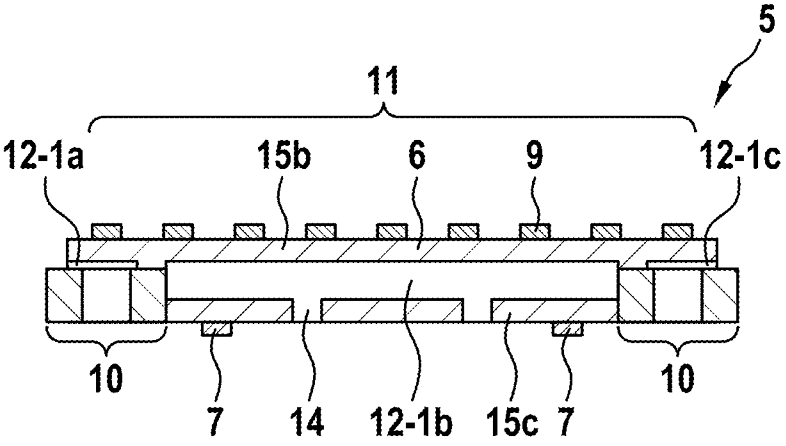

In FIGS. 6A and 6B, a bottom view and a lateral cross-sectional view of a connecting element 5 of the device 1 according to a fifth embodiment are shown, wherein the lateral cross-sectional view in FIG. 6B is shown along the section line A-A illustrated in FIG. 6A. In its base structure, the connecting element 5 according to the fifth embodiment is comparable with the connecting element 5 according to the third embodiment. In the fifth embodiment, the base structure 6, as shown, has laterally open cavity regions 12-1*a* and 12-1*c* into which the spring structures 10 of the connecting element 5 dip in portions. This makes it possible to provide a compact connecting element 5 with an integrated functional component.

Figure 7A:
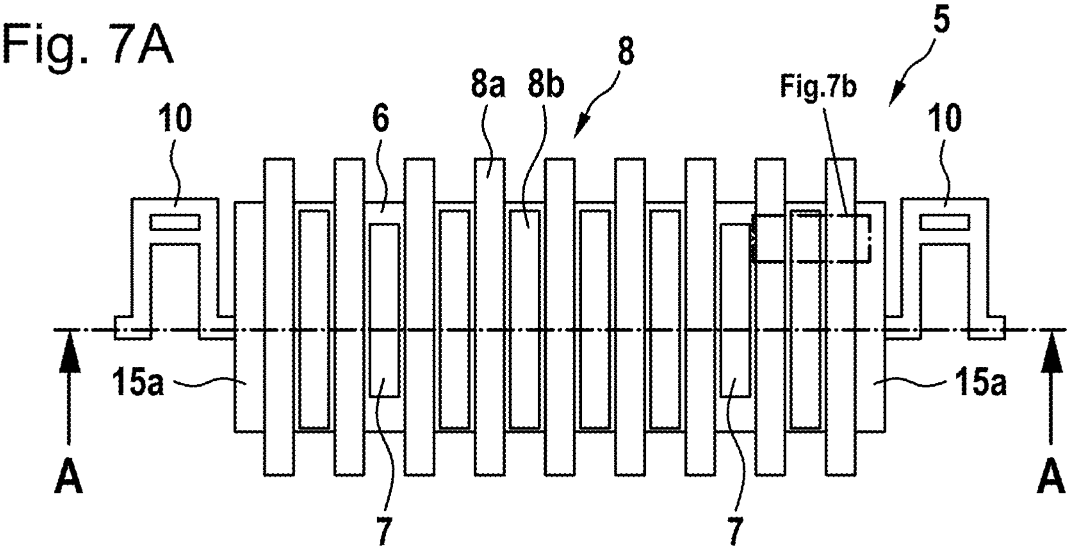
FIGS. 7A-7C show a bottom view, a detailed view of the bottom view and a lateral cross-sectional view of a connecting element of the device according to a sixth example embodiment of the present invention.
Figure 7B:
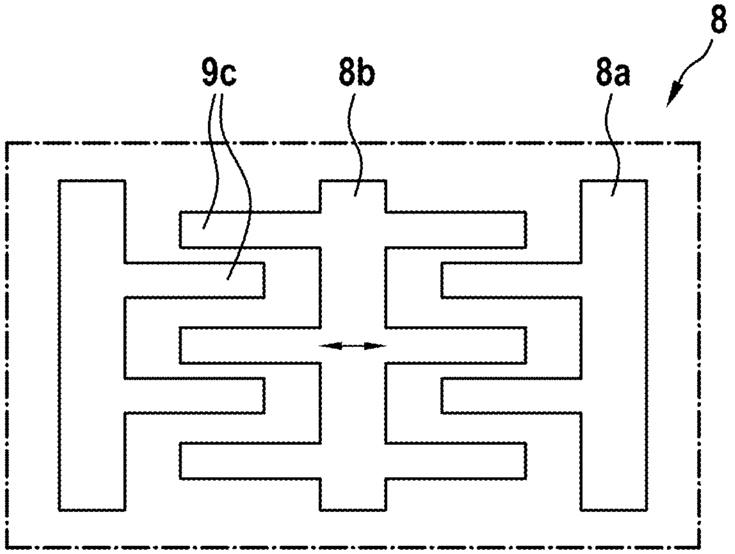
Figure 7C:
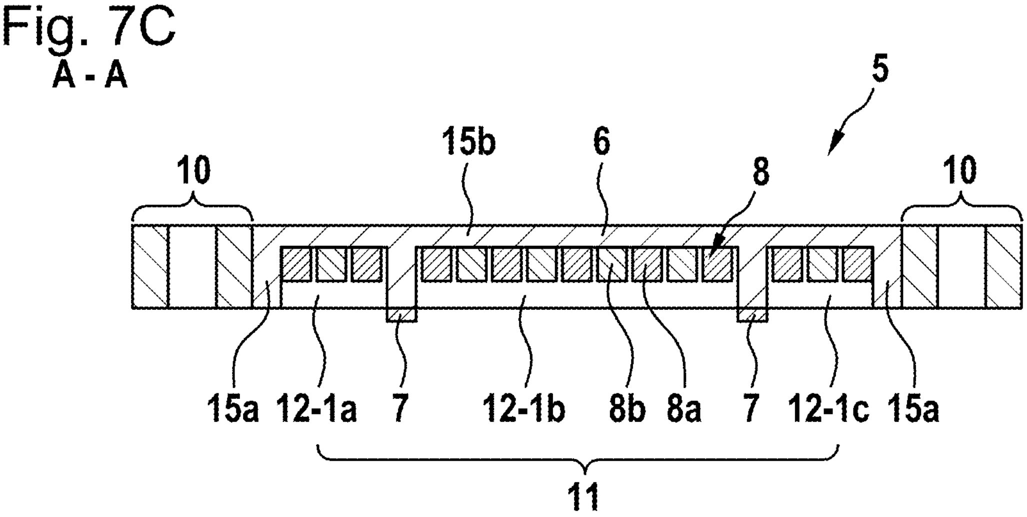

In FIGS. 7A, 7B and 7C, a bottom view, a detailed view and a lateral cross-sectional view of a connecting element 5 of the device 1 according to a sixth embodiment are shown, wherein the lateral cross-sectional view in FIG. 7C is shown along the section line A-A illustrated in FIG. 7A. In its base structure, the connecting element 5 according to the sixth embodiment is comparable with the connecting element 5 according to the first embodiment. According to the sixth embodiment, the drive apparatus 8 of the device 1 is arranged in a material recess 12, here in cavity regions 12-1*a*, 12-1*b* and 12-1*c*. As a result, the drive apparatus 8 can be arranged in the device 1 in a space-saving manner and efficiently integrated into the connecting element 5. The drive apparatus 8 has fixed drive elements 8*a* and movable drive elements 8*b*, which are movable relative to one another, for example by an electrical signal, and can entrain the connecting element 5 with them. As shown in FIG. 7B, the fixed drive elements 8*a* and the movable drive elements 8*b* can be designed as comb electrode bars with comb electrode fingers 8*c* in order to enable a uniform and precisely controllable drive movement.

Figure 8A:
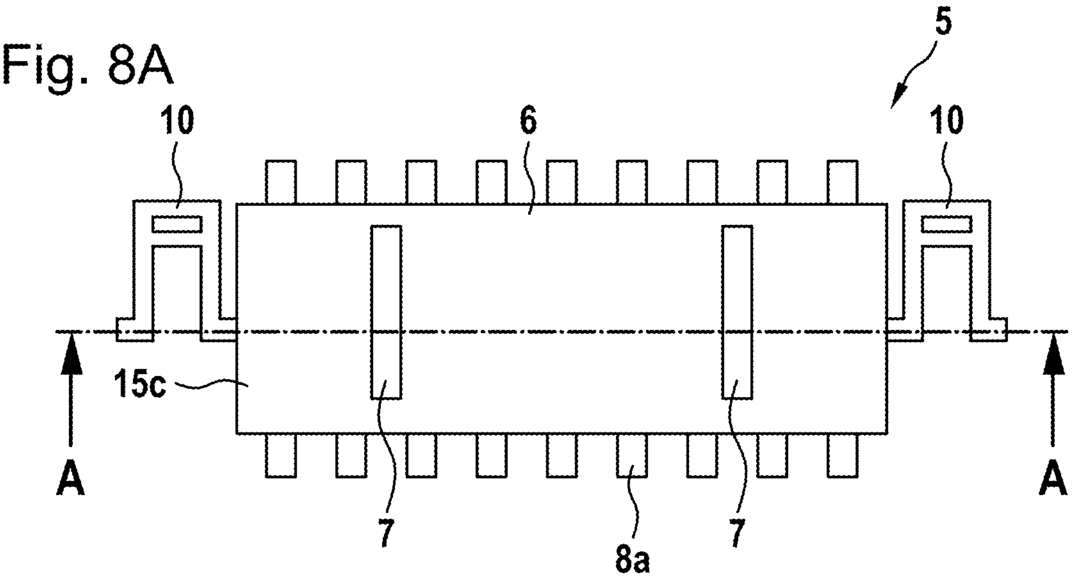
FIGS. 8A-8B show a bottom view and a lateral cross-sectional view of a connecting element of the device according to a seventh example embodiment of the present invention.
Figure 8B:
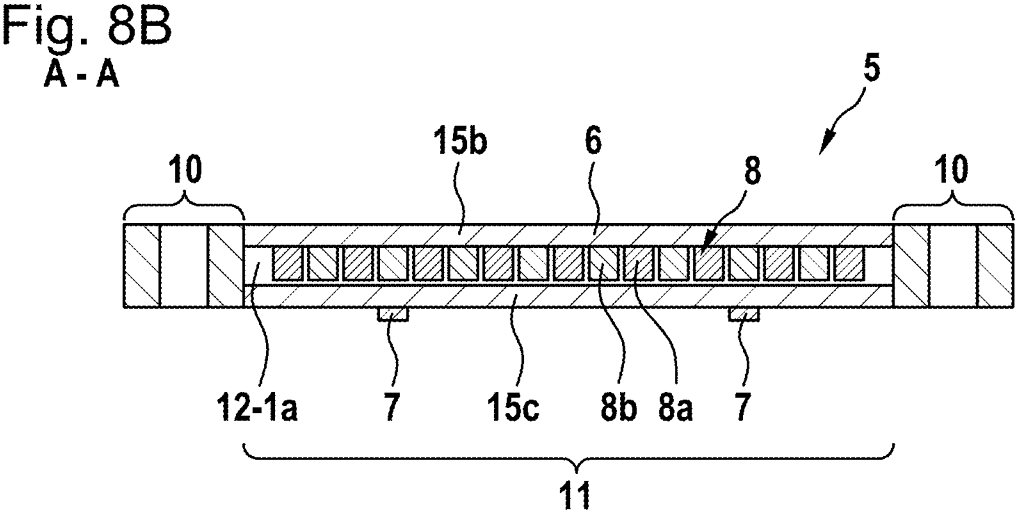

In FIGS. 8A and 8B, a bottom view and a lateral cross-sectional view of a connecting element 5 of the device 1 according to a seventh embodiment are shown, wherein the lateral cross-sectional view in FIG. 8B is shown along the section line A-A illustrated in FIG. 8A. In its base structure, the connecting element 5 according to the seventh embodiment is comparable with the connecting element 5 according to the sixth embodiment. According to the seventh embodiment, the base structure 6 in the mass reduction portion 11 has a continuous cavity region 12-1 as a material recess 12, in which the drive apparatus 8 is arranged. The drive apparatus 8 is protected in a sandwich-like manner between a bottom wall 15*c* and a cover wall 15*b*. The coupling structures 7 are integrally formed on the bottom wall 15*c*.

Figure 9:
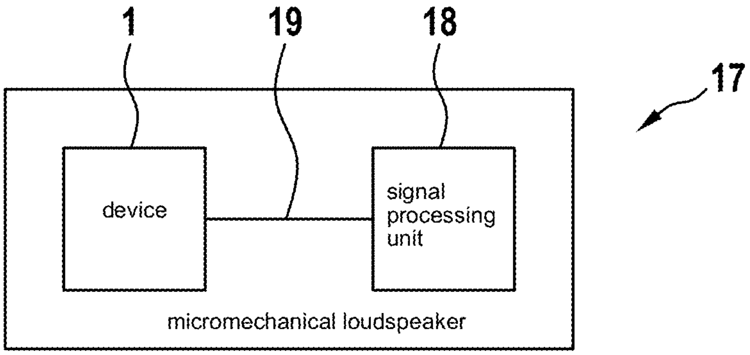
FIG. 9 shows a schematic diagram of a microelectromechanical loudspeaker having a microelectromechanical device, according to an example embodiment of the present invention.

FIG. 9 schematically shows a microelectromechanical loudspeaker 17 having a device 1 according to the above-described features and a signal processing unit 18 which is connected to the device 1 by a signal connection 19 and is designed to apply and process signals from the microelectromechanical device 1. The displacer unit 2 of the device 1 is configured to generate sound pressure as fluid pressure. By reducing the mass of the base structure 6 of the connecting element 5 of the device 1, a higher efficiency of the loudspeaker 17 can be achieved, among other things. The microelectromechanical loudspeaker 17 can be, for example, implemented as a system-on-chip.

What is claimed is:

1. A microelectromechanical device for generating a fluid pressure, comprising:

a displacer unit including a movable displacer element which can be deflected to generate the fluid pressure using a drivable connecting element acting on the displacer element;

wherein the drivable connecting element has a base structure and a coupling structure connected to the base structure for connecting the drivable connecting element to the displacer element, and wherein the base structure includes a mass reduction portion with a material recess.

2. The device according to claim 1, wherein the material recess is formed as a cavity region which occupies a partial volume of at least 5% of a total volume of the base structure.

3. The device according to claim 2, wherein the coupling structure is a coupling rib extending through the cavity region.

4. The device according to claim 1, wherein the coupling structure has a material reinforcement in portions.

5. The device according to claim 1, wherein the base structure has at least one wall structure with a predominantly closed wall surface.

6. The device according to claim 1, wherein the base structure has at least one etching channel for producing the material recess.

7. The device according to claim 1, wherein the material recess is a micropore which occupies a partial volume of at most 20% of a total volume of the base structure.

8. The device according to claim 1, wherein the mass reduction portion has at least two spatially separated material recesses.

9. The device according to claim 1, wherein the drivable connecting element has a spring structure which is arranged at least in portions in a material recess of the base structure.

10. The device according to claim 1, wherein the drivable connecting element has a spring structure which is formed integrally with the base structure.

11. The device according to claim 1, wherein the device has a drive apparatus which is arranged at least in portions in a material recess of the base structure of the drivable connecting element.

12. The device according to claim 11, wherein the drive apparatus has at least one fixed drive element and at least one movable drive element.

13. A microelectromechanical loudspeaker, comprising:

a microelectromechanical device for generating a fluid pressure, including:

a displacer unit including a movable displacer element which can be deflected to generate the fluid pressure using a drivable connecting element acting on the displacer element, wherein the drivable connecting element has a base structure and a coupling structure connected to the base structure for connecting the drivable connecting element to the displacer element, and wherein the base structure includes a mass reduction portion with a material recess, wherein the displacer unit is configured to generate sound pressure as the fluid pressure; and a signal processing unit configured to apply and process signals from the microelectromechanical device.

* * * * *